(12) United States Patent
Choi

(10) Patent No.: US 7,811,633 B2
(45) Date of Patent: Oct. 12, 2010

(54) OPTICAL ABSORBER LAYERS FOR SOLAR CELL AND METHOD OF MANUFACTURING THE SAME

(75) Inventor: In-hwan Choi, Goyang-si (KR)

(73) Assignee: In-Solar Tech Co., Ltd., Seoul (KR)

(*) Notice: Subject to any disclaimer, the term of this patent is extended or adjusted under 35 U.S.C. 154(b) by 432 days.

(21) Appl. No.: 11/813,674

(22) PCT Filed: Feb. 3, 2005

(86) PCT No.: PCT/KR2005/000326

§ 371 (c)(1),
(2), (4) Date: Jul. 11, 2007

(87) PCT Pub. No.: WO2006/075811

PCT Pub. Date: Jul. 20, 2006

(65) Prior Publication Data

US 2008/0092954 A1    Apr. 24, 2008

(30) Foreign Application Priority Data

Jan. 12, 2005    (KR) .................. 10-2005-0002969

(51) Int. Cl.
*C23C 16/00* (2006.01)
*B28B 19/00* (2006.01)
(52) U.S. Cl. .................... 427/248.1; 136/252
(58) Field of Classification Search .......... None
See application file for complete search history.

(56) References Cited

U.S. PATENT DOCUMENTS 5,015,503 A * 5/1991 Varrin et al. ............. 117/99
2002/0006470 A1 * 1/2002 Eberspacher et al. ...... 427/216
2006/0204659 A1 * 9/2006 Choi ...................... 427/248.1

FOREIGN PATENT DOCUMENTS

| JP | 5 63324 | 3/1993 |
| JP | 9 219539 | 8/1997 |
| JP | 11 274534 | 10/1999 |
| JP | 2002 246617 | 8/2002 |
| KR | 10-2005-0013063 | * 2/2005 |

OTHER PUBLICATIONS

Choi, KR 10-2005-0013063, English translation.*

* cited by examiner

*Primary Examiner*—Timothy H Meeks
*Assistant Examiner*—Joseph Miller, Jr.
(74) *Attorney, Agent, or Firm*—Oblon, Spivak, McClelland, Maier & Neustadt, L.L.P.

(57) ABSTRACT

Disclosed herein is a light-absorbing layer for a solar cell with enhanced sunlight absorption comprising $CuGaSe_2$, $CuIn_{1-x}Ga_xSe_2$ and $CuInSe_2$ thin films laminated one another. Further disclosed is a method of manufacturing the light absorbing layer. The method comprises the steps of: forming an InSe thin film from a single precursor containing In and Se on a substrate by metal organic chemical vapor deposition; forming a $Cu_2Se$ thin film using a Cu precursor on the InSe thin film by metal organic chemical vapor deposition; forming a $CuGaSe_2$ thin film using a single precursor containing Ga and Se on the $Cu_2Se$ thin film by metal organic chemical vapor deposition; and forming a $CuGaSe_2/CuInSe_2$ multilayer thin-film structure using the single precursor containing In and Se and the Cu precursor on the $CuGaSe_2$ thin film by metal organic chemical vapor deposition.

11 Claims, 9 Drawing Sheets

US 7,811,633 B2

OPTICAL ABSORBER LAYERS FOR SOLAR CELL AND METHOD OF MANUFACTURING THE SAME

BACKGROUND OF THE INVENTION

1. Field of the Invention

The present invention relates to a light-absorbing layer for a solar cell and a method of manufacturing the light-absorbing layer. More particularly, the present invention relates to a light-absorbing layer for a solar cell with enhanced sunlight absorption comprising $CuInSe_2$, $CuGaSe_2$ and $CuIn_{1-x}Ga_xSe_2$ thin films laminated by metal organic chemical vapor deposition (MOCVD), and a method of manufacturing the light-absorbing layer.

2. Description of the Related Art

Ternary thin films, including $CuInSe_2$ (hereinafter, referred to simply as "CIS") and $CuIn_{1-x}Ga_xSe_2$ (hereinafter, referred to simply as "CIGS"), are compound semiconductors on which a number of studies have been actively undertaken.

Unlike conventional solar cells employing silicon, CIS-based thin film solar cells can be manufactured to have a thickness not greater than 10 microns and exhibit superior stability even after long-term use. In addition, CIS-based thin film solar cells are experimentally proven to possess a maximum conversion efficiency of 19.8% as compared to conventional solar cells. Accordingly, CIS-based thin film solar cells have attracted commercial interest for replacing silicon solar cells in terms of low price and high efficiency.

For successful commercialization, various methods for forming CIS thin films have been recently reported. For example, details of one method for forming CIS thin films are described in Korean Patent Application No. 2004-29221, which was filed by the present applicant. According to this method, first, an InSe thin film is formed from $[Me_2In—(\mu SeMe)]_2$ as a precursor on a substrate by metal organic chemical vapor deposition, a $Cu_2Se$ thin film is formed using (hfac)Cu(DMB) as a precursor on the InSe thin film by metal organic chemical vapor deposition, and then a $CuInSe_2$ thin film is formed using $[Me_2In—(\mu SeMe)]_2$ as a precursor on the $Cu_2Se$ thin film by metal organic chemical vapor deposition. Further, a $CuIn_{1-x}Ga_xSe_2$ thin film is formed using $[Me_2Ga—(\mu SeMe)]_2$ as a precursor on the $CuInSe_2$ thin film by metal organic chemical vapor deposition.

As described above, CIS-based thin film solar cells show a high-energy conversion efficiency close to 20%, but they should be formed in a multilayer structure in order to further increase the efficiency. Sunlight contains abundant invisible ultraviolet and infrared rays as well as visible rays having a photon energy between about 1.7 eV (i.e. red ray having a wavelength of 700 nm) and 3.0 eV (i.e. violet ray having a wavelength of 400 nm). Consequently, techniques for forming CIS-based thin films into a multilayer structure are required in the fabrication of high-efficiency solar cells for absorbing incoming light with various energies.

To efficiently convert the entire spectrum of sunlight to electrical energy, light-absorbing layers having different bandgap energies should be arranged in a multilayer structure. It is known that the theoretical energy conversion efficiency of solar cells employing CIS is 42% for 2-layer solar cells, 49% for 3-layer solar cells, 53% for 4-layer solar cells, and a maximum of 68% for 5 or more-layer solar cells. In this manner, a cell termed a "tandem cell" can be fabricated by continuously or discontinuously varying the compositions of light-absorbing layers. CIS-based compound thin films are polyatomic materials. When CIS-based compound thin films are formed into a multilayer structure, the constituent atoms are diffused at the interface between upper and lower layers, losing inherent characteristics of the thin films. For this reason, the fabrication of high-quality tandem cells presents considerable difficulties.

SUMMARY OF THE INVENTION

Therefore, the present invention has been made in view of the above problems of the prior art, and it is an object of the present invention to provide a light-absorbing layer for a solar cell comprising a plurality of laminated CIS-based compound thin films as polyatomic thin films wherein no substantial diffusion of constituent atoms of the thin films takes place at the interface between upper and lower layers of the thin films.

It is another object of the present invention to provide a method of manufacturing the light-absorbing layer.

In accordance with one embodiment of the present invention, there is provided a method of manufacturing a light-absorbing layer for a solar cell comprising the steps of: forming a compound thin film of the structural formula BX from a single precursor containing a Group III element (hereinafter, designated as "B" or "C", B being larger in atomic number than C) (B) and a Group VI element (hereinafter, designated as "X") on a substrate by metal organic chemical vapor deposition (step 1); forming a compound thin film of the structural formula $A_2X$ by supplying a metal from a precursor containing a Group I metal element (hereinafter, designated as "A") to the compound thin film of the structural formula BX by metal organic chemical vapor deposition (step 2); forming a compound thin film of the structural formula $ACX_2$ using a single precursor containing a Group III element (C) and a Group VI element (X) on the compound thin film of the structural formula $A_2X$ by metal organic chemical vapor deposition (step 3); and forming a compound thin film of the structural formula $ABX_2$ using the single precursor containing a Group III element (B) and a Group VI element (X) on the compound thin film of the structural formula $ACX_2$ by metal organic chemical vapor deposition, thus achieving the formation of a multilayer thin-film structure of the structural formula $ACX_2/ABX_2$ (step 4). The Group I element (A) is used in a larger amount than an optimum stoichiometric equivalence ratio to form the compound thin film of the structural formula $A_2X$ in step 2 so that the element (A) is replenished during formation of the compound thin film of the structural formula $ABX_2$ in step 4.

The light-absorbing layer for a solar cell thus manufactured has a multilayer thin-film structure of the structural formula $ACX_2/ABX_2$ comprising: a substrate; a compound thin film (a first layer) of the structural formula $ACX_2$ composed of a Group I element (hereinafter, designated as "A"), a Group III element (hereinafter, designated as "B" or "C", B being larger in atomic number than C) (C) and a Group VI element (hereinafter, designated as "X"); and a compound thin film (a second layer) of the structural formula $ABX_2$ composed of a Group I element (A), a Group III element (B) and a Group VI element (X).

In accordance with another embodiment of the present invention, there is provided a method of manufacturing a light-absorbing layer for a solar cell comprising the steps of: forming a compound thin film of the structural formula BX from a single precursor containing a Group III element (hereinafter, designated as "B" or "C", B being larger in atomic number than C) (B) and a Group VI element (hereinafter, designated as "X") on a substrate by metal organic chemical vapor deposition (step 1); forming a compound thin film of the structural formula $A_2X$ by supplying a metal from a precursor containing a Group I metal element (hereinafter, designated as "A") to the compound thin film of the structural formula BX by metal organic chemical vapor deposition (step 2); forming a compound thin film of the structural formula $ACX_2$ using a single precursor containing a Group III element (C) and a Group VI element (X) on the compound thin film of the structural formula $A_2X$ by metal organic chemical vapor deposition (step 3); forming a compound thin film of the structural formula $ABX_2$ using the single precursor containing a Group III element (B) and a Group VI element (X) on the compound thin film of the structural formula $ACX_2$ by metal organic chemical vapor deposition, thus forming a multilayer thin-film structure of the structural formula $ACX_2/ABX_2$ (step 4); and supplying a metal from a precursor containing a Group I element (A) to the compound thin film of the structural formula $ACX_2/ABX_2$ so as to replenish the element (A) to the thin film, and completely forming the multilayer thin-film structure of the structural formula $ACX_2/ABX_2$ using the single precursor containing a Group III element (B) and a Group VI element (X) by metal organic chemical vapor deposition (step 5). At this time, the Group I element (A) is used in an optimum stoichiometric equivalence ratio to form the compound thin film of the structural formula $A_2X$ in step 2.

The light-absorbing layer for a solar cell thus manufactured has a multilayer thin-film structure of the structural formula $ACX_2/ABX_2$ comprising: a substrate; a compound thin film (a first layer) of the structural formula $ACX_2$ composed of a Group I element (hereinafter, designated as "A"), a Group III element (hereinafter, designated as "B" or "C", B being larger in atomic number than C) (C) and a Group VI element (hereinafter, designated as "X"); and a compound thin film (a second layer) of the structural formula $ABX_2$ composed of a Group I element (A), a Group III element (B) and a Group VI element (X).

The method according to the embodiment of the present invention may further comprise the step of forming a multilayer thin-film structure of the structural formula $ACX_2/A(B,C)X_2$ using a single precursor containing a Group III element (C) and a Group VI element (X) on the multilayer thin-film structure of the structural formula $ACX_2/ABX_2$ formed in step 5 by metal organic chemical vapor deposition (step 6). The light-absorbing layer for a solar cell thus manufactured has a multilayer thin-film structure of the structural formula $ACX_2/A(B,C)X_2$ comprising: a substrate; a compound thin film (a first layer) of the structural formula $ACX_2$ composed of a Group I element (hereinafter, designated as "A"), a Group III element (hereinafter, designated as "B" or "C", B being larger in atomic number than C) (C) and a Group VI element (hereinafter, designated as "X"); and a compound thin film (a second layer) of the structural formula $A(B,C)X_2$ composed of a Group I element (A), Group III elements (B) and (C), and a Group VI element (X).

The method according to the embodiment of the present invention may further comprise the step of supplying a metal from a precursor containing a Group I element (A) to the multilayer thin-film structure of the structural formula $ACX_2/A(B,C)X_2$ formed in step 6 so as to replenish the element (A) to the multilayer thin-film structure, and forming a compound thin film of the structural formula $ABX_2$ using the single precursor containing a Group III element (B) and a Group VI element (X) thereon by metal organic chemical vapor deposition, thus achieving the formation of a multilayer thin-film structure of the structural formula $ACX_2/A(B,C)X_2/ABX_2$ (step 7). The light-absorbing layer for a solar cell thus manufactured has a multilayer thin-film structure of the structural formula $ACX_2/A(B,C)X_2/ABX_2$ comprising: a substrate; a compound thin film (a first layer) of the structural formula $ACX_2$ composed of a Group I element (hereinafter, designated as "A"), a Group III element (hereinafter, designated as "B" or "C", B being larger in atomic number than C) (C) and a Group VI element (hereinafter, designated as "X"); a compound thin film (a second layer) of the structural formula $A(B,C)X_2$ composed of a Group I element (A), Group III elements (B) and (C), and a Group VI element (X); and a compound thin film (a third layer) of the structural formula $ABX_2$ composed of a Group I element (A), a Group III element (B), and a Group VI element (X).

In accordance with still another embodiment of the present invention, there is provided a method of manufacturing a light-absorbing layer for a solar cell comprising the steps of: forming a compound thin film of the structural formula BX from a single precursor containing a Group III element (hereinafter, designated as "B") and a Group VI element (hereinafter, designated as "X") on a substrate by metal organic chemical vapor deposition (step 1); forming a compound thin film of the structural formula $A_2X$ using a precursor containing a Group I metal element (hereinafter, designated as "A") to the compound thin film of the structural formula BX by metal organic chemical vapor deposition (step 2); forming a compound thin film of the structural formula $ABX_2$ using a single precursor containing a Group III element (B) and a Group VI element (X) on the compound thin film of the structural formula $A_2X$ by metal organic chemical vapor deposition, thus achieving the formation of a first p-type semiconductor layer (step 3); forming a PN or PIN heterojunction on the first p-type semiconductor layer to fabricate a first cell (step 4); forming an insulating buffer layer on the first cell (step 5); forming a compound thin film of the structural formula BX from a single precursor containing a Group III element (B) and a Group VI element (X) on the buffer layer by metal organic chemical vapor deposition (step 6); forming a compound thin film of the structural formula $A_2X$ by supplying a metal from a precursor containing a Group I element (A) to the compound thin film of the structural formula BX by metal organic chemical vapor deposition (step 7); forming a compound thin film of the structural formula $ABX_2$ using a single precursor containing a Group III element (B) and a Group VI element (X) on the compound thin film of the structural formula $A_2X$ by metal organic chemical vapor deposition, thus achieving the formation of a second p-type semiconductor layer (step 8); and forming a PN or PIN heterojunction on the second p-type semiconductor layer to fabricate a second cell, thus achieving the formation of a multilayer cell structure of first cell/insulating layer/second cell (step 9), wherein the $ABX_2$ thin film constituting the first cell has a different bandgap energy from that constituting the second cell.

The light-absorbing layer for a solar cell thus manufactured comprises a substrate; a first layer including a compound thin film of the structural formula $ABX_2$ composed of a Group I element (hereinafter, designated as "A"), a Group III element (hereinafter, designated as "B") and a Group VI element (hereinafter, designated as "X"), and a PN or PIN heterojunction formed thereon; an insulating second layer formed on the first layer; and a third layer including a compound thin film of the structural formula $ABX_2$ composed of a Group I element (A), a Group III element and a Group VI element (X), and a PN or PIN heterojunction formed thereon, wherein the $ABX_2$ thin film constituting the first layer has a different bandgap energy from that constituting the third layer.

BRIEF DESCRIPTION OF THE DRAWINGS

The above and other objects, features and other advantages of the present invention will be more clearly understood from the following detailed description taken in conjunction with the accompanying drawings, in which.

BEST MODE

Methods of manufacturing light-absorbing layers for a solar cell according to the preferred embodiments of the present invention will now be described in more detail with reference to the accompanying drawings. However, these embodiments are given for the purpose of illustration and are not to be construed as limiting the scope of the invention.

Figure 1:
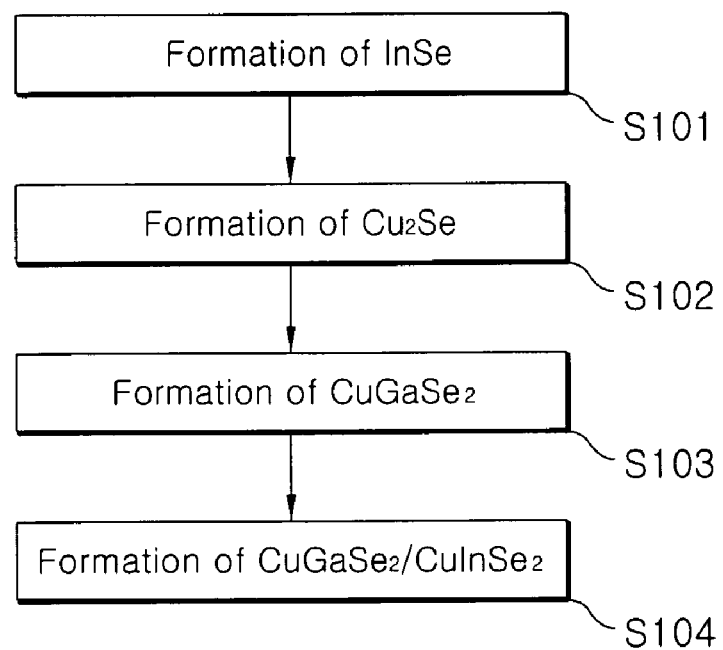
FIG. 1 is a flow chart showing a method of manufacturing a light-absorbing layer for a solar cell according to a first embodiment of the present invention.

FIG. 1 is a flow chart schematically showing a method of manufacturing a light-absorbing layer for a solar cell according to a first embodiment of the present invention.

As shown in FIG. 1, an InSe thin film (S101) is formed from $[Me_2In\text{—}(\mu SeMe)]_2$ as a single precursor containing indium (In) and selenium (Se) on a substrate by MOCVD. Me used herein refers to methyl, and $\mu$ represents double bridge bonding between Se and In. Since an absorbing layer having a relatively higher bandgap energy forms an upper side of a solar cell and an absorbing layer having a relatively lower bandgap energy is brought into contact with a back electrode, a transparent electrode covered with a ZnO or CdS thin film should be used as the substrate.

A $Cu_2Se$ thin film (S102) is formed by supplying (hfac)Cu (DMB) as a Cu (I) precursor to the InSe thin film formed in S101 by MOCVD. hfac is an abbreviation for hexafluoroacetylaceto, and DMB is an abbreviation for 3,3-dimethyl-1-butene.

A $CuGaSe_2$ thin film is formed using $[Me_2Ga\text{—}(\mu SeMe)]_2$ as a single precursor containing Ga and Se on the $Cu_2Se$ thin film formed in S102 by MOCVD (S103).

A $CuGaSe_2/CuInSe_2$ multilayer thin-film structure is formed using $[Me_2In\text{—}(\mu SeMe)]_2$ as a single precursor containing In and Se on the $CuGaSe_2$ thin film formed in S103 by MOCVD (S104).

At this step, the amount of the Cu precursor or process conditions are controlled so that Cu is contained in a slightly larger amount than an optimum stoichiometric equivalence ratio. As a result, the formation of the $CuInSe_2$ thin film is enabled by the supply of In and Se only in S104. Specifically, the excess amount of Cu contained in the $CuGaSe_2$ thin film is diffused into the upper side during deposition of the $CuInSe_2$ thin film, leading to the formation of the $CuGaSe_2/CuInSe_2$ multilayer thin-film structure.

A low-pressure MOCVD apparatus is used to grow thin films in the present invention. The low-pressure MOCVD apparatus is equipped with a plurality of bubblers containing the corresponding precursors, such as (hfac)Cu(DMB), $[Me_2In\text{—}(\mu SeMe)]_2$ and $[Me_2Ga\text{—}(\mu SeMe)]_2$. Accordingly, sequential use of the bubblers enables formation of a multilayer thin-film structure of CIS, CGS and CIGS in a batch manner.

Figure 2:
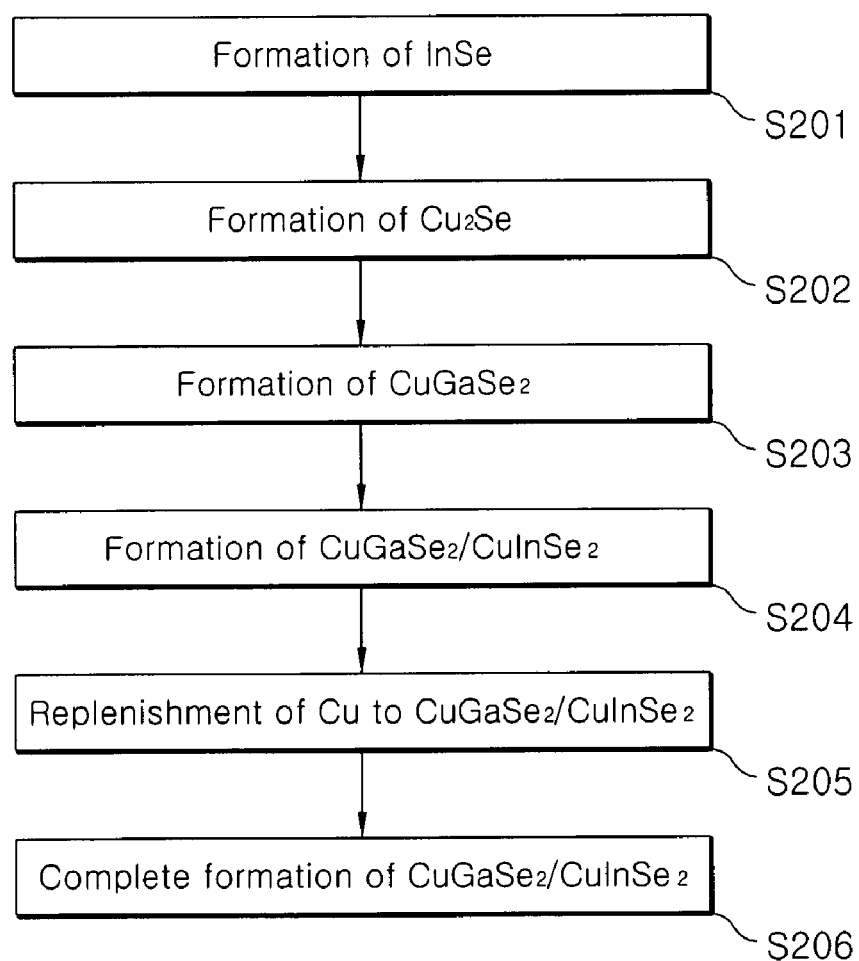
FIG. 2 is a flow chart showing a method of manufacturing a light-absorbing layer for a solar cell according to a second embodiment of the present invention.

FIG. 2 is a flow chart schematically showing a method of manufacturing a light-absorbing layer for a solar cell according to a second embodiment of the present invention.

As shown in FIG. 2, an InSe thin film is formed from $[Me_2In\text{—}(\mu SeMe)]_2$ as a single precursor containing indium (In) and selenium (Se) on a substrate by MOCVD (S201). Me used herein refers to methyl, and $\mu$ represents double bridge bonding between Se and In. The substrate is a transparent electrode covered with a ZnO or CdS thin film.

A $Cu_2Se$ thin film is formed by supplying (hfac)Cu(DMB) as a Cu (I) precursor to the InSe thin film formed in S201 by MOCVD (S202). hfac is an abbreviation for hexafluoroacetylaceto, and DMB is an abbreviation for 3,3-dimethyl-1-butene.

A $CuGaSe_2$ thin film is formed using $[Me_2Ga\text{—}(\mu SeMe)]_2$ as a single precursor containing Ga and Se on the $Cu_2Se$ thin film formed in S202 by MOCVD (S203).

A $CuInSe_2$ thin film $[Me_2In\text{—}(\mu SeMe)]_2$ is formed using as a single precursor containing In and Se on the $CuGaSe_2$ thin film formed in S203 by MOCVD (S204). At this step, In and Se only are supplied, but a portion of Cu contained in the $CuGaSe_2$ thin film as a lower layer is diffused to form the $CuInSe_2$ thin film as an upper layer.

(hfac)Cu(DMB) as a Cu precursor is supplied to the $CuInSe_2$ thin film formed in S204 such that Cu is replenished to the Cu-deficient $CuInSe_2$ thin film (S205). Next, $[Me_2In\text{—}(\mu SeMe)]_2$ as a single precursor containing In and Se is used to completely form the $CuInSe_2$ thin film by MOCVD, thus achieving the formation of a $CuGaSe_2/CuInSe_2$ multilayer thin-film structure (S206). At this step, In and Se only are supplied, but a portion of the Cu replenished in S205 is used to form the $CuInSe_2$ thin film. In the embodiment of the present invention, the amount of the Cu precursor or process conditions in S202 are controlled so that Cu is contained in an appropriate amount corresponding to an optimum stoichiometric equivalence ratio in the $Cu_2Se$ thin film, unlike in the first embodiment.

Figure 3:
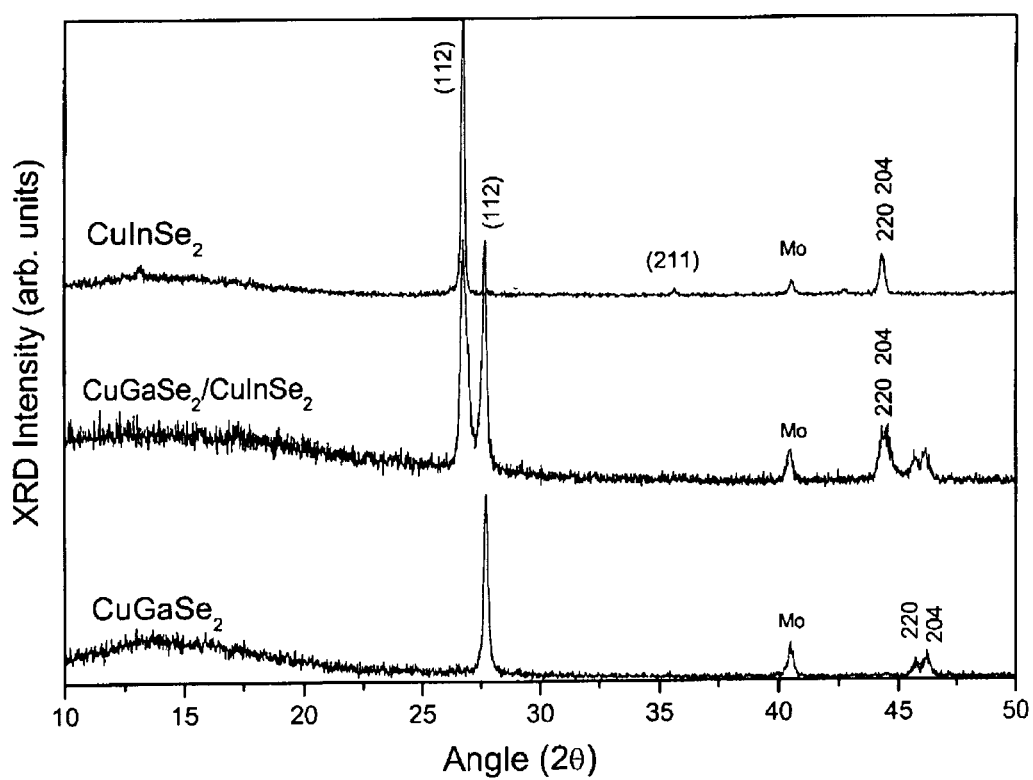
FIG. 3 shows the X-ray diffraction (XRD) pattern of a $CuGaSe_2/CuInSe_2$ multilayer thin-film structure formed by a method of the present invention.

FIG. 3 shows the X-ray diffraction (XRD) pattern of the $CuGaSe_2/CuInSe_2$ multilayer thin-film structure formed by the method according to the second embodiment of the present invention. For comparison, the XRD patterns of the single $CuInSe_2$ and $CuGaSe_2$ thin films are additionally shown in FIG. 3. In the XRD pattern of the $CuGaSe_2/CuInSe_2$ multilayer thin-film structure, the peak at 26.62° (2θ) corresponds to (211) plane of the $CuInSe_2$, and the peak at 27.66° (2θ) corresponds to (211) plane of the $CuGaSe_2$. The peaks at 44.25° (2θ) correspond to (220) and (204) planes of the $CuInSe_2$, and the peaks at 45.64° (2θ) and 46.17° (2θ) correspond to (220) and (204) planes of the $CuGaSe_2$, respectively. The peaks corresponding to (220) and (204) planes of the $CuInSe_2$ overlap, while the peaks corresponding to (220) and (204) of the $CuGaSe_2$ are separated. The reason why the peaks corresponding to (220) and (204) of the $CuGaSe_2$ are separately observed is because the unit cell of the CuInSe$_2$ has a lattice constant (a) of c/2 while that of the CuGaSe$_2$ has a lattice constant (a) greater than c/2, which indicates the occurrence of compression distortion.

Figure 4:
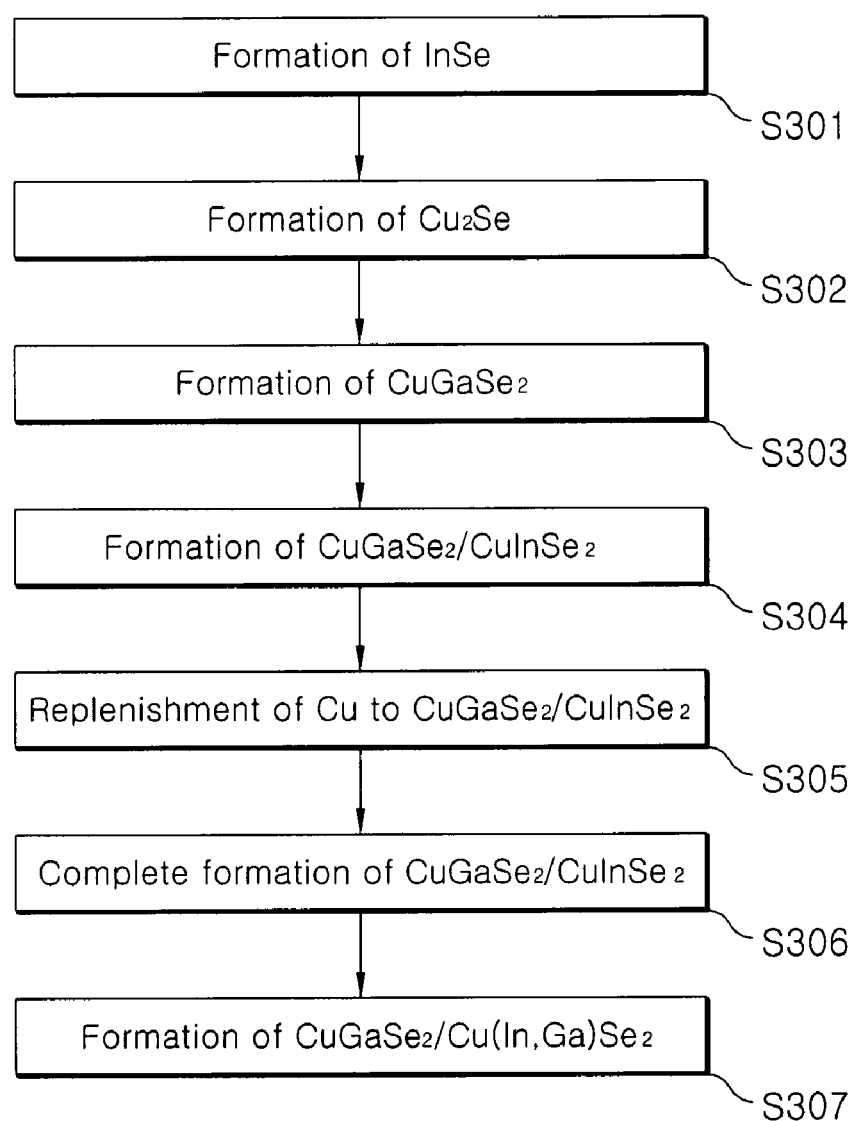
FIG. 4 is a flow chart showing a method of manufacturing a light-absorbing layer for a solar cell according to a third embodiment of the present invention.

FIG. 4 is a flow chart schematically showing a method of manufacturing a light-absorbing layer for a solar cell according to a third embodiment of the present invention.

S301 to S306 are identical to S201 to S206 of the second embodiment, respectively. After S306, a CuGaSe$_2$/CuIn$_{1-x}$Ga$_x$Se$_2$ multilayer thin-film structure is formed using [Me$_2$Ga—(μSeMe)]$_2$ as a single precursor containing Ga and Se on the CuGaSe$_2$/CuInSe$_2$ multilayer thin-film structure by MOCVD (S307).

Figure 5:
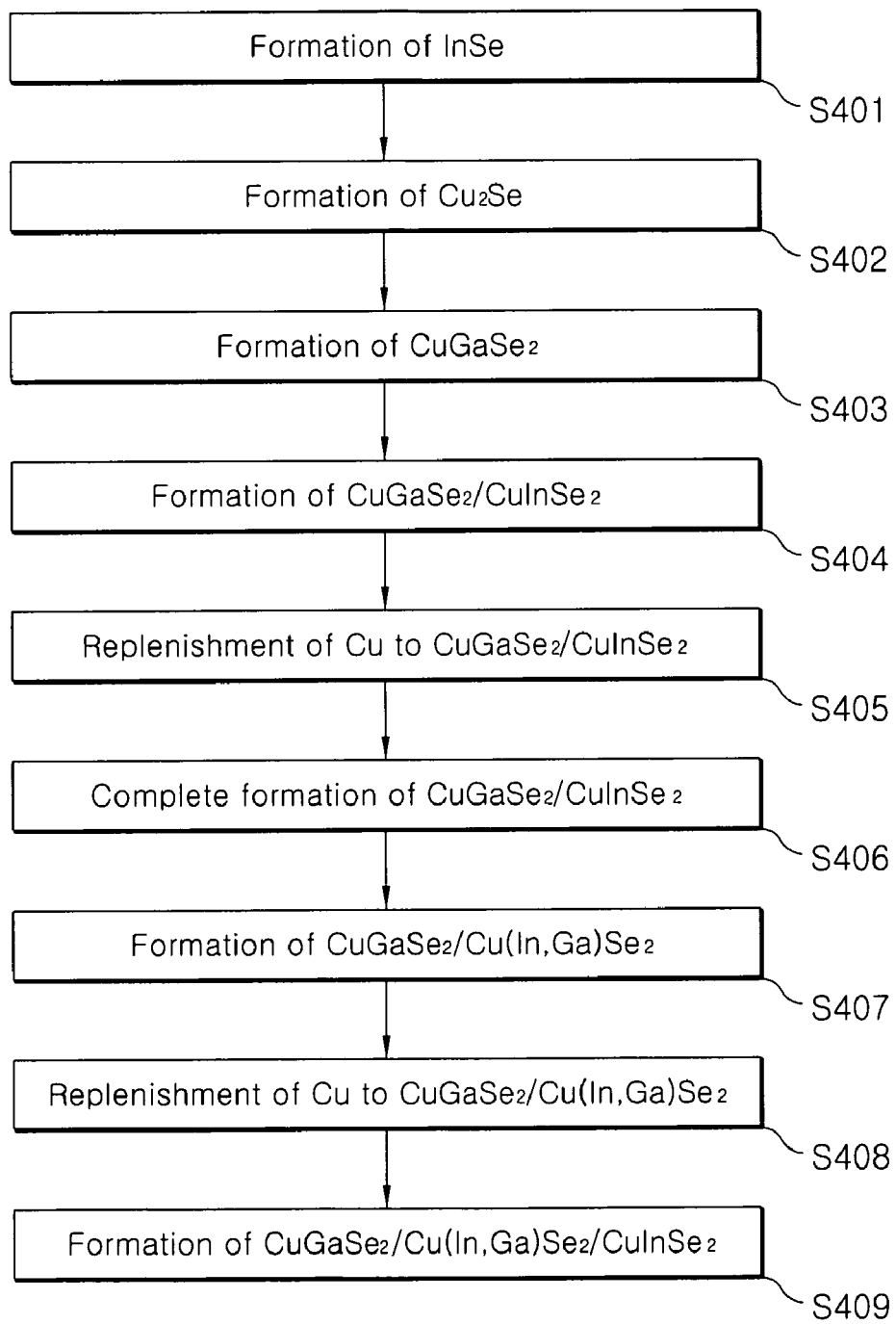
FIG. 5 is a flow chart showing a method of manufacturing a light-absorbing layer for a solar cell according to a fourth embodiment of the present invention.

FIG. 5 is a flow chart schematically showing a method of manufacturing a light-absorbing layer for a solar cell according to a fourth embodiment of the present invention.

S401 to S407 are identical to S301 to S307 of the third embodiment, respectively. After S407, (hfac)Cu(DMB) as a Cu precursor is supplied to the CuGaSe$_2$/CuIn$_{1-x}$Ga$_x$Se$_2$ multilayer thin-film structure to replenish Cu to the multilayer thin-film structure (S408). Subsequently, a CuGaSe$_2$/CuIn$_{1-x}$Ga$_x$Se$_2$/CuInSe$_2$ multilayer thin-film structure is formed using [Me$_2$In—(μSeMe)]$_2$ as a single precursor containing In and Se on the CuGaSe$_2$/CuIn$_{1-x}$Ga$_x$Se$_2$ multilayer thin-film structure by MOCVD (S409).

Figure 6:
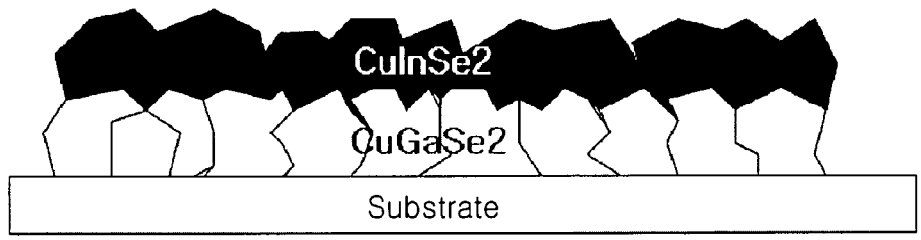
FIG. 6 is a sectional view of a $CuGaSe_2/CuInSe_2$ multilayer thin-film structure formed by a method of the present invention.
Figure 7:
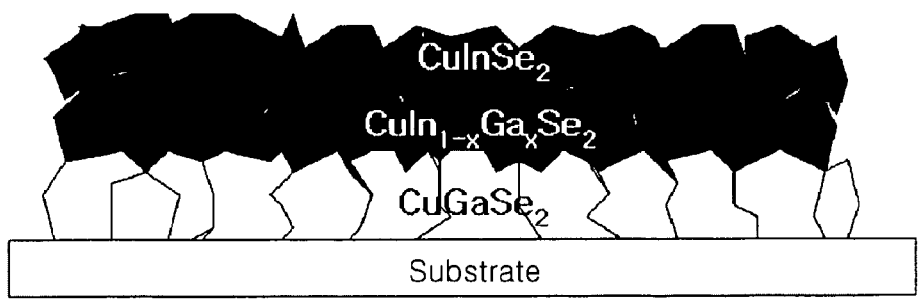
FIG. 7 is a sectional view of a $CuGaSe_2/CuIn_xGa_{1-x}Se_2$ multilayer thin-film structure formed by a method of the present invention.

FIG. 6 is a sectional view of the CuGaSe$_2$/CuInSe$_2$ multilayer thin-film structure formed in the first or second embodiment of the present invention. FIG. 7 is a sectional view of the CuGaSe$_2$/CuIn$_{1-x}$Ga$_x$Se$_2$ multilayer thin-film structure formed in the fourth embodiment of the present invention.

Figure 8:
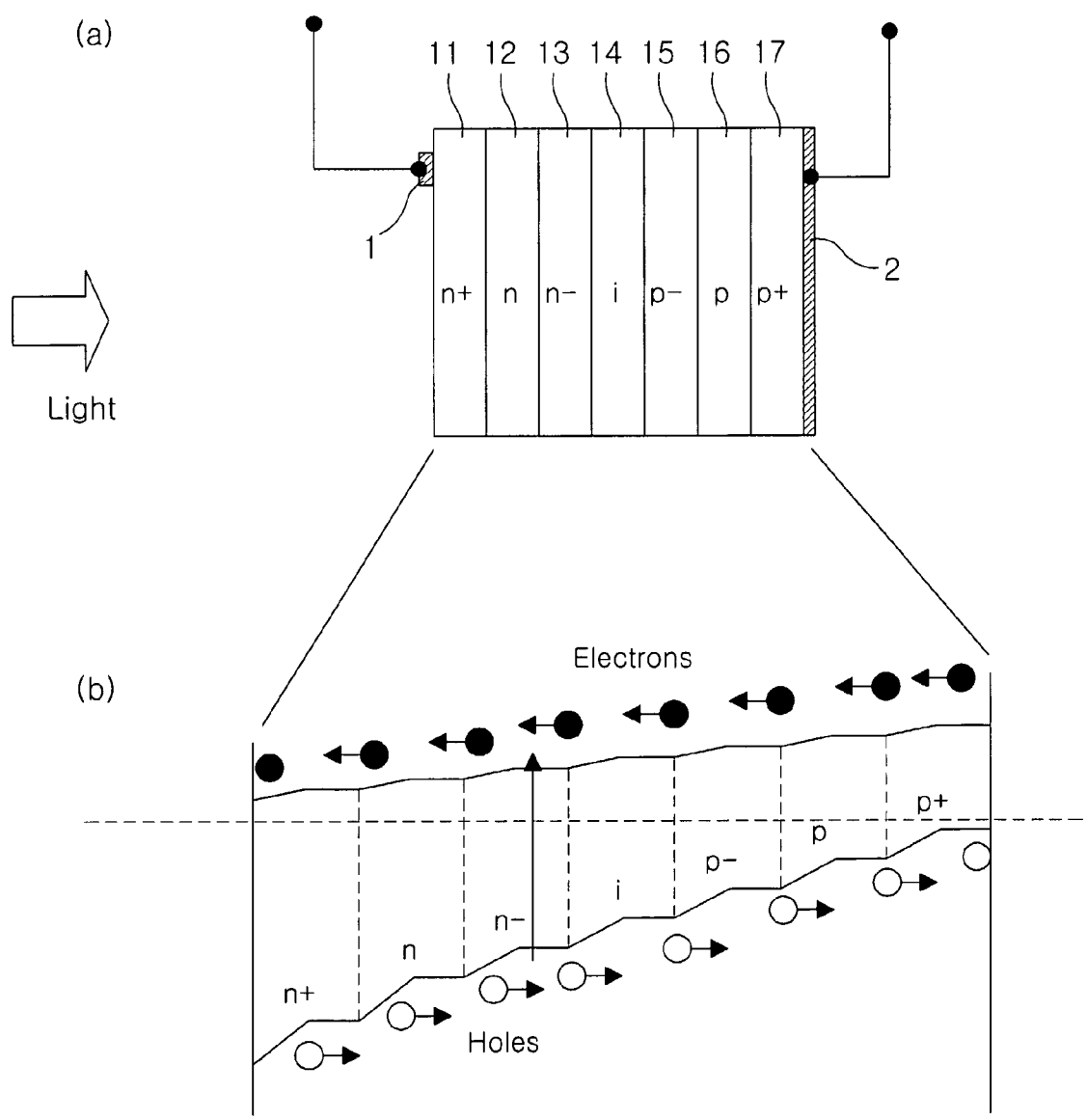
FIGS. 8(a) and 8(b) are conceptual views showing the structure and energy band of a multilayer thin-film structure formed by a method of the present invention, respectively.

FIGS. 8(a) and 8(b) schematically show the structure and energy band of the multilayer thin-film structure formed in any one of the first to fourth embodiments of the present invention, respectively. Referring to FIGS. 8(a) and 8(b), n-type semiconductor layers 11, 12 and 13, an insulating layer 14, and p-type semiconductor layers 15, 16 and 17 are sandwiched between electrodes 1 and 2. It is preferred that the n-type semiconductor layers are made of ZnO thin films having different doping concentrations, the insulating layer (i) is made of a CdS thin film, and the p-type semiconductor layers are made of the multilayer thin-film structures formed in any one of the first to fourth embodiments. The p-type semiconductor layers are made of multilayer thin-film structures, for example, CuGaSe$_2$/CuInSe$_2$, CuAlSe$_2$/CuGaSe$_2$/CuInSe$_2$, CuGaSe$_2$/CuIn$_{1-x}$Ga$_x$Se$_2$/CuInSe$_2$, and CuAlSe$_2$/CuIn$_{1-x}$Al$_x$Se$_2$/CuInSe$_2$. Since these p-type semiconductor layers have different bandgap energies, they can absorb light having various energies and can efficiently convert the entire spectrum of sunlight to electrical energy.

Figure 9:
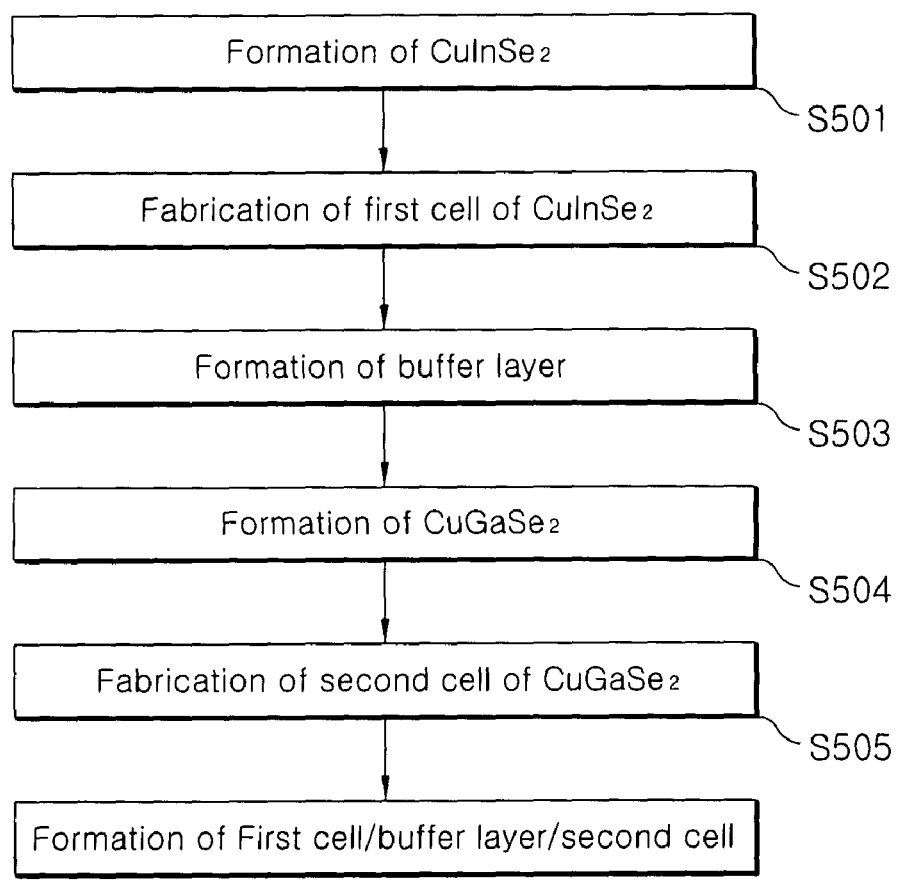
FIG. 9 is a flow chart showing a method of manufacturing a light-absorbing layer for a solar cell according to a fifth embodiment of the present invention.

FIG. 9 is a flow chart schematically showing a method of manufacturing a light-absorbing layer for a solar cell according to a fifth embodiment of the present invention.

The CuInSe$_2$ thin film is formed in accordance with the method of the first embodiment to form a first p-type semiconductor layer (S501).

A CdS or CdS/ZnO thin film is formed on the p-type semiconductor layer of the CuInSe$_2$ thin film formed in S501 to fabricate a first cell in which a PN or PIN heterojunction is formed (S502).

A buffer layer is formed on the first cell fabricated in S502 (S503). The buffer layer is made of an insulating material, such as a silicon oxide thin film.

A CuGaSe$_2$ thin film is formed on the first cell/buffer layer formed in S503 to form a p-type semiconductor layer (S504). At this step, the CuGaSe$_2$ thin film is formed by employing a precursor different from that of the method according to the first embodiment. The p-type semiconductor layer is not limited to the CuGaSe$_2$ thin film, and Group III elements other than Ga can be selected so as to have a bandgap energy different from that of the p-type semiconductor layer of the first cell.

A CdS or CdS/ZnO thin film is formed on the p-type semiconductor layer of the CuGaSe$_2$ thin film formed in S504 to fabricate a second cell in which a PN or PIN heterojunction is formed (S505).

An insulating layer is formed on the second cell fabricated in S505. Thereafter, the procedure of S501 to S505 is repeated to form a multilayer cell structure of PIN/buffer layer/PIN multilayer cell.

Figure 10:
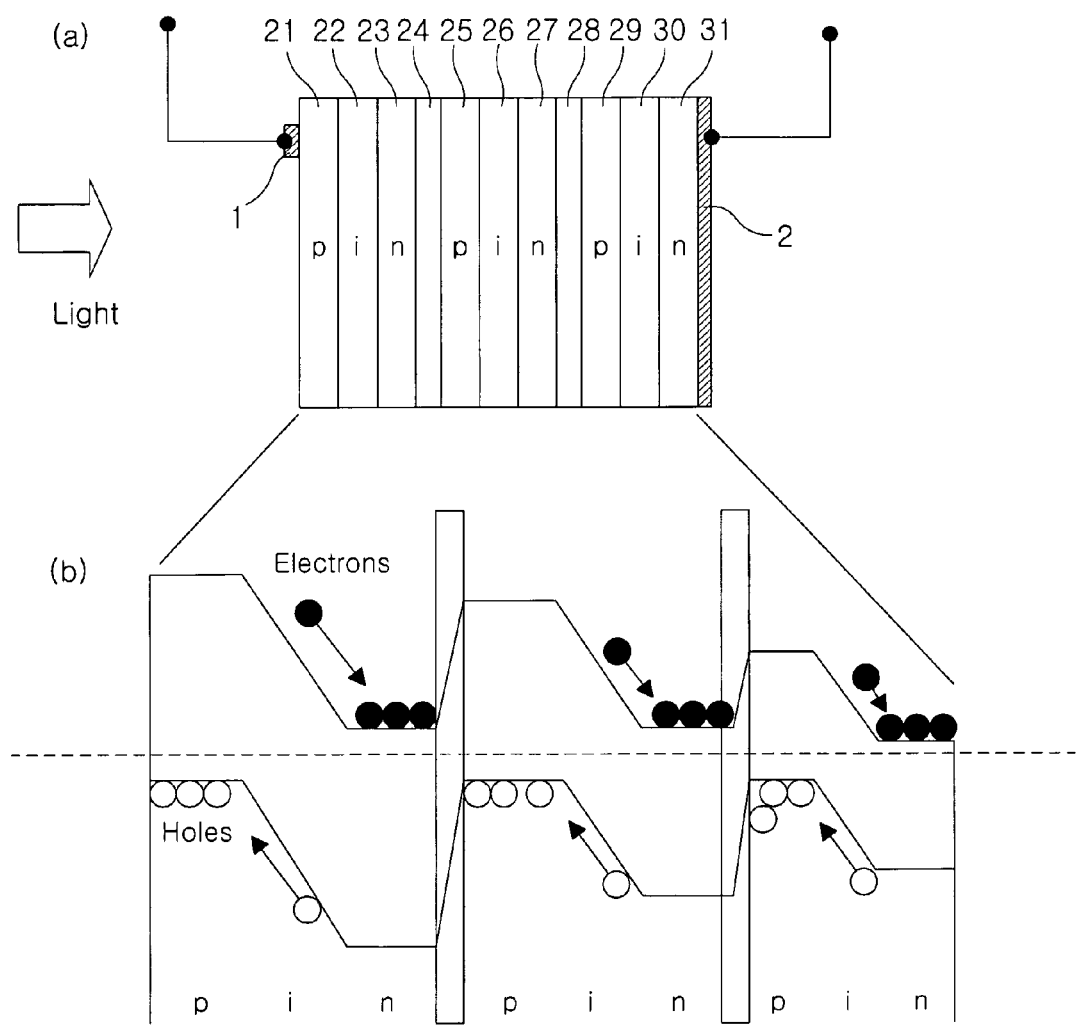
FIGS. 10(a) and 10(b) are conceptual views showing the structure and energy band of a multilayer thin-film structure formed by a method of the present invention, respectively.

FIGS. 10(a) and 10(b) schematically show the structure and energy band of a multilayer thin-film structure formed by the method according to the fifth embodiment of the present invention, respectively. Referring to FIGS. 10(a) and 10(b), between electrodes 1 and 2 are sandwiched a first cell consisting of a p-type semiconductor layer 21, an insulating layer 22 and an n-type semiconductor layer 23; a second cell consisting of a buffer layer 24, a p-type semiconductor layer 25, an insulating layer 26 and an n-type semiconductor layer 27; a buffer layer 28; and a third cell consisting of a p-type semiconductor layer 29, an insulating layer 30 and an n-type semiconductor layer 31. It is preferred that the n-type semiconductor layers are made of ZnO thin films, the insulating layers (i) are made of CdS thin films, and the p-type semiconductor layers are made of CuAlSe$_2$, CuGaSe$_2$, CuInSe$_2$ and Cu(In,Ga)Se$_2$, and other compound thin films. Since these p-type semiconductor layers have different bandgap energies, they can absorb light having various energies and can efficiently convert the entire spectrum of sunlight to electrical energy.

One example of light-absorbing layers for a solar cell that can be manufactured by the method is a multilayer thin-film structure consisting of CuAlSe$_2$/CdS/ZnO/buffer layer/CuGaSe$_2$/CdS/ZnO/buffer layer/Cu(In,Ga)Se$_2$/CdS/ZnO/buffer layer/CuInSe$_2$/CdS/ZnO. As described above, for efficient conversion of the entire spectrum of sunlight to electrical energy, the upper and lower compound thin films of the buffer layers are arranged in such a manner that they have different bandgap energies. Accordingly, it is evident that various modifications to the arrangement of the compound thin films can be made other than the above-mentioned arrangements. The buffer layers interposed between the upper and lower layers enable formation of stable multilayer thin-film structures with little consideration given to the atomic number of the Group III elements used in the first to fourth embodiments.

The thin films can be formed without any diffusion between the constituent atoms at the interface of the multilayer thin-film structures while maintaining the inherent characteristics of the multilayer thin-film structures. This is because compound thin films are formed using corresponding precursors by metal organic chemical vapor deposition, as disclosed in Korean Patent Application No. 2004-29221, which was filed by the present applicant, and because a thin film composed of relatively larger atoms is formed on a thin film composed of relatively smaller atoms. That is, since a Cu$_{1-x}$In$_x$GaSe or CuInSe$_2$ thin film containing In with a relatively large atomic size is formed on a CuGaSe$_2$ thin film containing Ga with a relatively small atomic size, diffusion of the In atoms present in the lower layer into the lower layer containing Ga atoms is prevented. On the other hand, the buffer layers interposed between the cells enable manufacture of a light-absorbing layer in a multilayer thin-film structure, irrespective of the size of atoms present in the upper and lower layers.

Although the present invention has been described herein with reference to the preferred embodiments, it is understood that the technical spirit of the present invention is not limited to these embodiments. Namely, $CuGaSe_2$, $CuIn_{1-x}Ga_xSe_2$ ($0 \geq x \geq 1$) and $CuInSe_2$ thin films are formed to manufacture light-absorbing layers for a solar cell in accordance with the preferred embodiments, but these compound thin films are some example of I-III-VI$_2$ compounds composed of elements selected from Group I, III and VI elements of the periodic table.

A detailed explanation will be provided with reference to the following specific examples.

In step 1, a compound thin film of the structural formula BX is formed from a single precursor containing a Group III element (hereinafter, designated as "B" or "C", B being larger in atomic number than C) (B) and a Group VI element (hereinafter, designated as "X") on a substrate by metal organic chemical vapor deposition (step 1). Examples of the Group III element (B or C) include all Group III elements of the periodic table, e.g., Al, Ga and In. Examples of the Group VI element (X) include all Group VI elements of the periodic table, e.g., Se, S and Te. Accordingly, examples of the grown compound thin films of the structural formula BX are InSe, GaSe, AlSe, InS, GaS, AlS, InTe, GaTe, AlTe, and the like.

In step 2, a compound thin film of the structural formula $A_2X$ is formed by supplying a metal from a precursor containing a Group I metal element (hereinafter, designated as "A") to the compound thin film of the structural formula BX by metal organic chemical vapor deposition. Examples of the Group I element (A) include all Group I elements of the periodic table, e.g., Cu and Ag. Accordingly, examples of the grown compound thin film of the structural formula $A_2X$ are $Cu_2Se$, $Cu_2S$, $Cu_2Te$, $Ag_2Se$, $Ag_2S$, $Ag_2Te$, and the like.

In step 3, a compound thin film of the structural formula $ACX_2$ is formed using a single precursor containing a Group III element (C) and a Group VI element (X) on the compound thin film of the structural formula $A_2X$ by metal organic chemical vapor deposition. Examples of the Group III element (C) include all Group III elements of the periodic table, e.g., In, Ga and Al, which are smaller in atomic number than the Group III elements (B) used in step 1.

In step 4, a compound thin film of the structural formula $ABX_2$ is formed using a single precursor containing a Group III element (B) and a Group VI element (X) on the compound thin film of the structural formula $ACX_2$ by metal organic chemical vapor deposition, thus achieving the formation of a multilayer thin-film structure of the structural formula $ACX_2/ABX_2$. Examples of the Group VI element (X) are equal to those used in step 1, but examples of the Group III element are different from those used in step 1. Namely, the Group III element (B) is larger in atomic number than the Group III element (C) used in step 3. The reason for this difference in atomic number is to prevent the diffusion of the deposited Group III element into the lower layer, as explained earlier.

Meanwhile, the selection principle of the Group III elements based on the difference in atomic number can be applied to the selection of the Group I and VI elements constituting the multilayer thin-film structure. Namely, the Group I and VI elements are selected in such a manner that the elements constituting the upper layer have larger atomic number than the elements constituting the lower layer.

Examples of multilayer thin-film structures that can be formed in the above method include, but are not limited to, $CuAlSe_2/CuGaSe_2$, $CuAlSe_2/CuInSe_2$, $CuGaSe_2/CuInSe_2$, $AgAlSe_2/AgGaSe_2$, $AgAlSe_2/AgInSe_2$, $AgGaSe_2/AgInSe_2$, $AgAlSe_2/CuGaSe_2$, $AgAlSe_2/CuInSe_2$, $AgGaSe_2/CuInSe_2$, $CuAlS_2/CuGaS_2$, $CuAlS_2/CuInS_2$, $CuGaS_2/CuInSe_2$, $CuAlSe_2/CuGaSe_2$, $CuAlS_2/CuInSe_2$, and $CuGaS_2/CuInSe_2$. Therefore, it should be interpreted that the technical spirit of the present invention covers any methods of manufacturing multilayer thin-film structures that can be represented by the structural formula $ACX_2/ABX_2$. Further, it should be noted that the Group III element (B) constituting the upper layer is larger in atomic number than the Group III element (C) constituting the lower layer in order to prevent the diffusion of the constituent elements at the interface between the upper and lower layers. This principle can be identically applied to the Group I and VI elements.

In step 5, a metal from a precursor containing a Group I element (A) is supplied to the compound thin film of the structural formula $ABX_2$ formed in step 4 so as to replenish the element (A) to the thin film, and then a multilayer thin-film structure of the structural formula $ACX_2/ABX_2$ is formed using a single precursor containing a Group III element (B) and a Group VI element (X) thereon by metal organic chemical vapor deposition.

In step 6, a multilayer thin-film structure of the structural formula $ACX_2/A(B,C)X_2$ is formed using a single precursor containing a Group III element (C) and a Group VI element (X) on the multilayer thin-film structure of the structural formula $ACX_2/ABX_2$ formed in step 5 by metal organic chemical vapor deposition.

In step 7, a metal from a precursor containing a Group I element (A) is supplied to the multilayer thin-film structure of the structural formula $ACX_2/A(B,C)X_2$ formed in step 6 so as to replenish the element (A) to the multilayer thin-film structure, and then a compound thin film of the structural formula $ABX_2$ is formed using a single precursor containing a Group III element (B) and a Group VI element (X) thereon by metal organic chemical vapor deposition, thus achieving the formation of a multilayer thin-film structure of the structural formula $ACX_2/A(B,C)X_2/ABX_2$.

An alternative example is as follows.

In step 1, a compound thin film of the structural formula BX is formed from a single precursor containing a Group III element (hereinafter, designated as "B") and a Group VI element (hereinafter, designated as "X") on a substrate by metal organic chemical vapor deposition.

In step 2, a compound thin film of the structural formula $A_2X$ is formed by supplying a metal from a precursor containing a Group I metal element (hereinafter, designated as "A") to the compound thin film of the structural formula BX by metal organic chemical vapor deposition.

In step 3, a compound thin film of the structural formula $ABX_2$ is formed using a single precursor containing a Group III element (B) and a Group VI element (X) on the compound thin film of the structural formula $A_2X$ by metal organic chemical vapor deposition, thus achieving the formation of a first p-type semiconductor layer.

In step 4, a PN or PIN heterojunction is formed on the first p-type semiconductor layer to fabricate a first cell.

In step 5, an insulating buffer layer is formed on the first cell.

In step 6, a compound thin film of the structural formula BX is formed from a single precursor containing a Group III element (B) and a Group VI element (X) on the buffer layer by metal organic chemical vapor deposition.

In step 7, a compound thin film of the structural formula $A_2X$ is formed by supplying a metal from a precursor containing a Group I element (A) to the compound thin film of the structural formula BX by metal organic chemical vapor deposition.

In step 8, a compound thin film of the structural formula $ABX_2$ is formed using a single precursor containing a Group III element (B) and a Group VI element (X) on the compound thin film of the structural formula $A_2X$ by metal organic chemical vapor deposition, thus achieving the formation of a second p-type semiconductor layer.

In step 9, a PN or PIN heterojunction is formed on the second p-type semiconductor layer to fabricate a second cell, thus achieving the formation of a multilayer cell structure of first cell/insulating layer/second cell.

At this time, the $ABX_2$ thin films of the first and second cells are formed in such a manner that they have different bandgap energies. For example, the Group III elements (B) constituting the $ABX_2$ thin films of the first and second cells may be different from each other. Alternatively, one of the $ABX_2$ thin films of the first and third layers may contain two or more Group III elements in the position of the Group III elements (B), as in the $CuIn_{1-x}Ga_xSe_2$ thin film.

Examples of the Group I element (A) used herein include all Group I elements of the periodic table, e.g., Cu and Ag. Examples of the Group III element (B) include all Group III elements of the periodic table, e.g., Al, Ga and In, and solid solution compounds thereof. Examples of the Group VI element (X) include all Group VI elements of the periodic table, e.g., Se, S and Te. Accordingly, the use of the buffer layer enables formation of various multilayer thin-film structures, irrespective of the size of atoms present in the upper and lower layers.

Examples of the single precursor containing Group III and VI elements are not limited to $[Me_2(III)-(\mu(VI)Me]_2$ type precursors, and thus it will be appreciated by those skilled in the art that, although not suggested in the present invention, various types of precursors can be used. This is because elements belonging to the same group of the periodic table have similar chemical behaviors and thus similar results are expected despite the use of different types of precursors. Likewise, examples of the Cu-containing precursor are not limited to (hfac)Cu(DMB).

INDUSTRIAL APPLICABILITY

As apparent from the foregoing, multilayer thin-film structures of I-III-VI$_2$ group compound semiconductors as polyatomic thin films can be formed without substantial diffusion of constituent atoms of the semiconductors at the interface between the upper and lower layers, contributing to greatly enhanced absorption of sunlight.

Although the foregoing embodiments of the present invention have been disclosed with reference to the accompanying drawings, they are not to be construed as limiting the technical spirit of the present invention. The scope of the present invention is defined by the claims that follow, and those skilled in the art will appreciate that various modifications and changes can be made within the spirit of the present invention. Accordingly, it is to be understood that such modifications and changes are within the scope of the present invention.

The invention claimed is:

1. A method of manufacturing a light-absorbing layer for a solar cell, comprising of:
   (a) forming a compound thin film of structural formula BX from a single precursor comprising a Group III element (hereinafter, designated as "B") and a Group VI element (hereinafter, designated as "X") on a substrate by metal organic chemical vapor deposition;
   (b) forming a compound thin film of structural formula $A_2X$ by supplying a metal from a precursor comprising a Group I metal element (hereinafter, designated as "A") to the compound thin film of the structural formula BX by metal organic chemical vapor deposition;
   (c) forming a compound thin film of the structural formula $ACX_2$ from a single precursor containing comprising a Group III element (hereinafter, designated as "C", C being smaller in atomic number than B) and a Group VI element (X) on the compound thin film of the structural formula $A_2X$ by metal organic chemical vapor deposition; and
   (d) forming a compound thin film of the structural formula $ABX_2$ from the single precursor comprising a Group III element (B) and a Group VI element (X) on the compound thin film of the structural formula $ACX_2$ by metal organic chemical vapor deposition, thus achieving the formation of a multilayer thin-film structure of the structural formula $ACX_2/ABX_2$.

2. The method according to claim 1, wherein an amount of the Group I element (A) is larger than the amount of the Group I element in an optimum stoichiometric equivalence ratio to form the compound thin film of the structural formula $A_2X$ in (b).

3. The method according to claim 1, further comprising (e) supplying a metal from a precursor comprising a Group I element (A) to the compound thin film of the structural formula $ACX_2/ABX_2$ formed in (d) so as to replenish the element (A) to the thin film, and completely forming the multilayer thin-film structure of the structural formula $ACX_2/ABX_2$ from the single precursor comprising a Group III element (B) and a Group VI element (X) by metal organic chemical vapor deposition.

4. The method according to claim 3, further comprising (f) forming a multilayer thin-film structure of the structural formula $ACX_2/A(B,C)X_2$ from a single precursor comprising a Group III element (C) and a Group VI element (X) on the multilayer thin-film structure of the structural formula $ACX_2/ABX_2$ formed in (e) by metal organic chemical vapor deposition.

5. The method according to claim 4, further comprising (g) supplying a metal from a precursor comprising a Group I element (A) to the multilayer thin-film structure of the structural formula $ACX_2/A(B,C)X_2$ formed in (f) so as to replenish the element (A) to the multilayer thin-film structure, and forming a compound thin film of the structural formula $ABX_2$ from the single precursor comprising a Group III element (B) and a Group VI element (X) thereon by metal organic chemical vapor deposition, thus achieving the formation of a multilayer thin-film structure of the structural formula $ACX_2/A(B,C)X_2/ABX_2$.

6. The method according to claim 3, wherein the Group I element (A) is in an optimum stoichiometric equivalence ratio to form the compound thin film of the structural formula $A_2X$ in (b).

7. The method according to claim 1, wherein the Group I element (A) is copper (Cu), the Group III element (B) is indium (In), the Group III element (C) is gallium (Ga) or aluminum (Al), and the Group VI element (X) is selenium (Se).

8. A method of manufacturing a light-absorbing layer for a solar cell comprising:
   (1) forming a compound thin film of structural formula BX from a single precursor comprising a Group III element (hereinafter, designated as "B") and a Group VI element (hereinafter, designated as "X") on a substrate by metal organic chemical vapor deposition;
   (2) forming a compound thin film of the structural formula $A_2X$ by supplying a metal from a precursor comprising a Group I metal element (hereinafter, designated as "A")

to the compound thin film of the structural formula BX by metal organic chemical vapor deposition;
(3) forming a compound thin film of the structural formula $ABX_2$ from a single precursor comprising a Group III element (B) and a Group VI element (X) on the compound thin film of the structural formula $A_2X$ by metal organic chemical vapor deposition, thus achieving the formation of a first p-type semiconductor layer;
(4) forming a PN or PIN heterojunction on the first p-type semiconductor layer to fabricate a first cell;
(5) forming an insulating buffer layer on the first cell;
(6) forming a compound thin film of the structural formula BX from a single precursor comprising a Group III element (B) and a Group VI element (X) on the buffer layer by metal organic chemical vapor deposition;
(7) forming a compound thin film of the structural formula $A_2X$ by supplying a metal from a precursor comprising a Group I element (A) to the compound thin film of the structural formula BX by metal organic chemical vapor deposition;
(8) forming a compound thin film of the structural formula $ABX_2$ from a single precursor comprising a Group III element (B) and a Group VI element (X) on the compound thin film of the structural formula $A_2X$ by metal organic chemical vapor deposition, thus achieving the formation of a second p-type semiconductor layer; and
(9) forming a PN or PIN heterojunction on the second p-type semiconductor layer to fabricate a second cell, thus achieving the formation of a multilayer cell structure of first cell/insulating layer/second cell,
wherein the $ABX_2$ thin film constituting the first cell has a different bandgap energy from the $ABX_2$ thin film constituting the second cell.

9. The method according to claim 8, wherein the Group III elements (B) constituting the $ABX_2$ thin films of the first and second cells are different from each other.

10. The method according to claim 8, wherein one of the $ABX_2$ thin films of the first and second cells comprises two or more Group III elements in the position of the Group III element (B).

11. The method according to claim 8, wherein the Group I element (A) is copper (Cu), the Group III element (B) is indium (In), gallium (Ga) or aluminum (Al), and the Group VI element (X) is selenium (Se).

\* \* \* \* \*